United States Patent

Wei

[11] Patent Number: 6,157,691
[45] Date of Patent: Dec. 5, 2000

[54] FULLY INTEGRATED PHASE-LOCKED LOOP WITH RESISTOR-LESS LOOP FILER

[75] Inventor: Shuran Wei, Bloomington, Minn.

[73] Assignee: LSI Logic Corporation, Milpitas, Calif.

[21] Appl. No.: 09/059,943

[22] Filed: Apr. 14, 1998

[51] Int. Cl.[7] ................................................ H03D 3/24
[52] U.S. Cl. ...................... 375/376; 327/148; 327/149; 327/150; 327/156; 375/373; 375/374
[58] Field of Search .................... 375/376, 373, 375/374; 327/147, 148, 149, 150, 156, 157, 158, 270; 713/503

[56] References Cited

U.S. PATENT DOCUMENTS

| | | | |
|---|---|---|---|
| 5,068,628 | 11/1991 | Ghoshal | 331/1 A |
| 5,400,370 | 3/1995 | Guo | 375/118 |
| 5,410,263 | 4/1995 | Waizman | 327/141 |
| 5,594,392 | 1/1997 | Kondoh et al. | 331/57 |
| 5,838,204 | 11/1998 | Yao | 331/1 R |
| 5,969,552 | 10/1999 | Lee et al. | 327/158 |
| 5,970,110 | 10/1999 | Li | 377/48 |

OTHER PUBLICATIONS

Ilya I. Novof, "Fully Integrated CMOS Phase–Locked Loop with 15 to 240 MHz Locking Range and ±150 ps Jitter", *IEEE Journal of Solid–State Circuits*, vol. 30, No. 11, Nov. 1995.

*Primary Examiner*—Stephen Chin
*Assistant Examiner*—Mohammad Ghayour

[57] ABSTRACT

A phase-locked loop includes a phase detector, a charge pump, a resistor-less loop filter and a voltage-controlled oscillator ("VCO"). The phase detector has a reference input, a feedback input, and a charge control output. The charge pump is coupled to the charge control output, and the resistor-less loop filter is coupled to the charge pump. The VCO has a control voltage input coupled to the resistor-less loop filter, a clock output coupled to the feedback input and a plurality of delay elements which are coupled together in series to form a ring oscillator. Each delay element includes a delay element output. A MOSFET gate oxide capacitance is coupled between each delay element output and the charge control output.

15 Claims, 4 Drawing Sheets

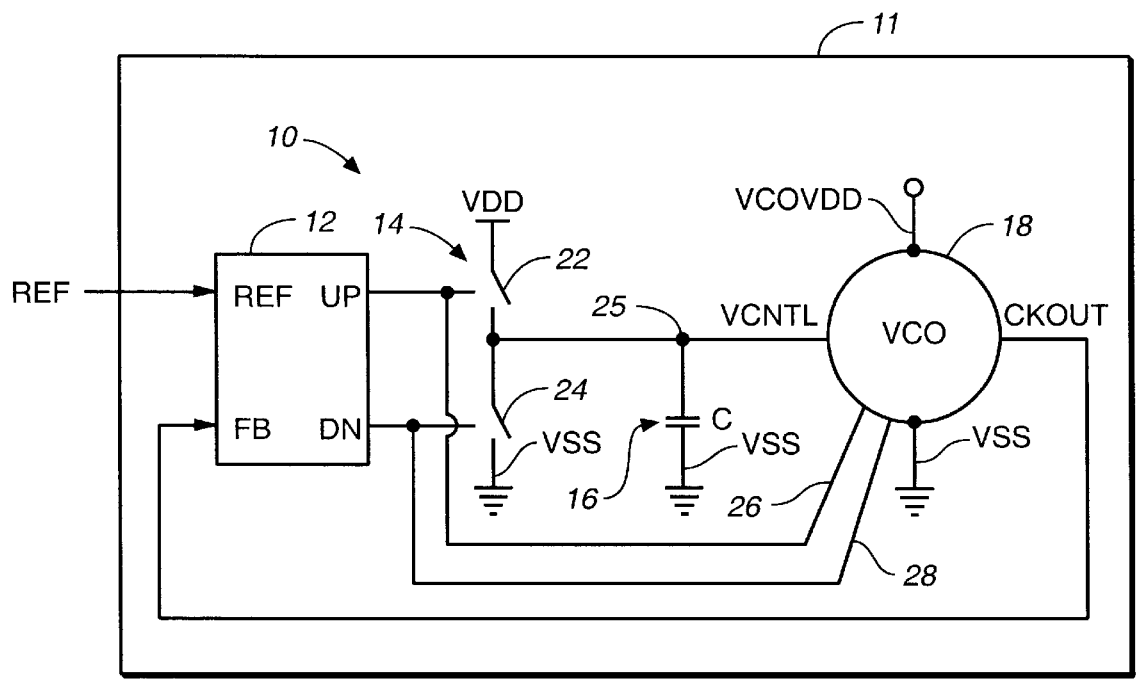
FIG._1
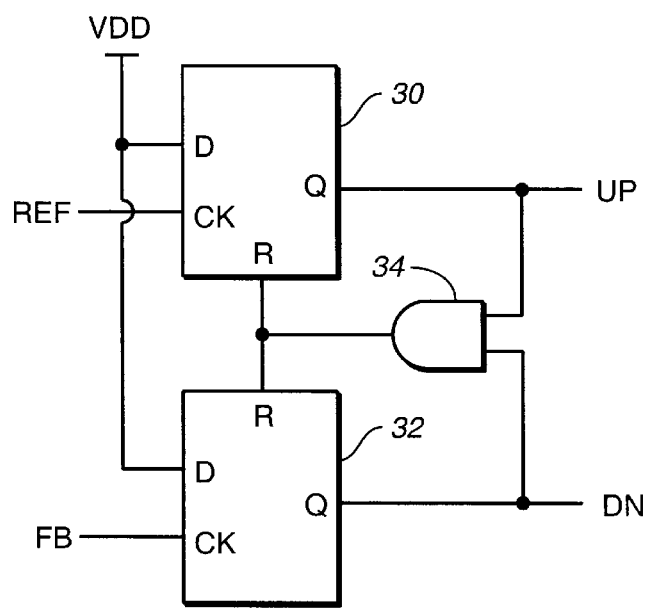
FIG._2

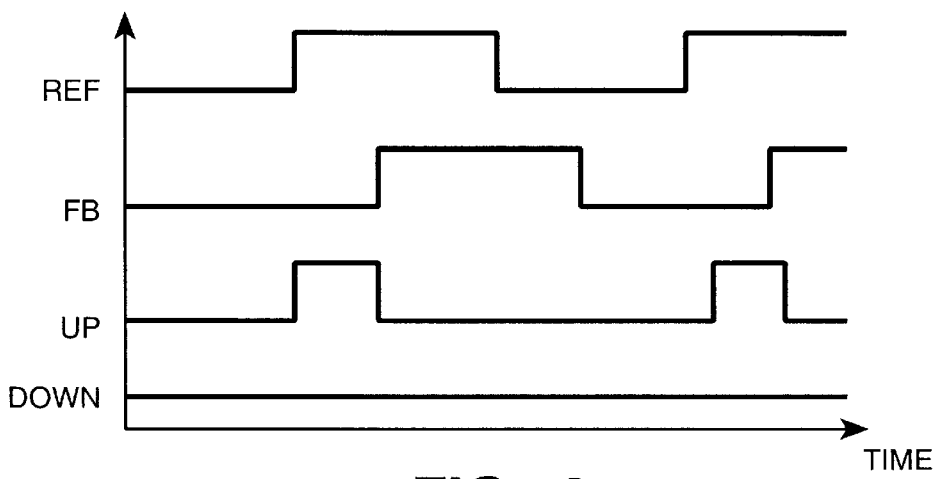
FIG._3
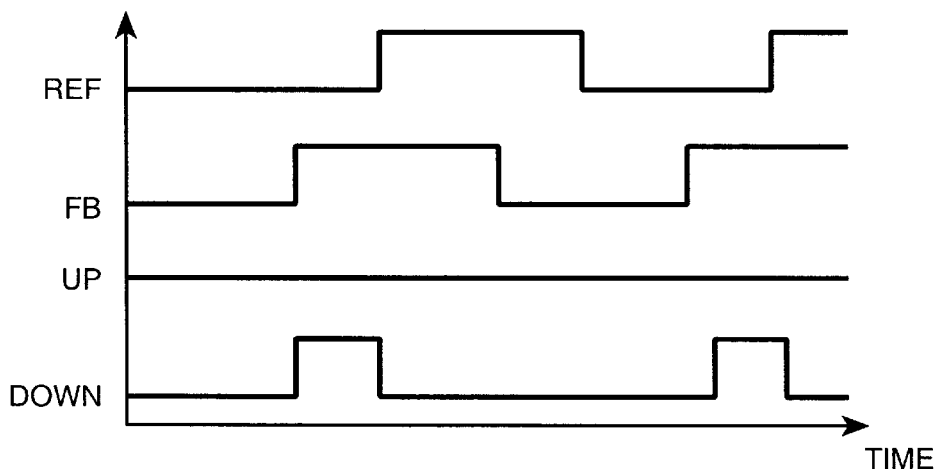
FIG._4
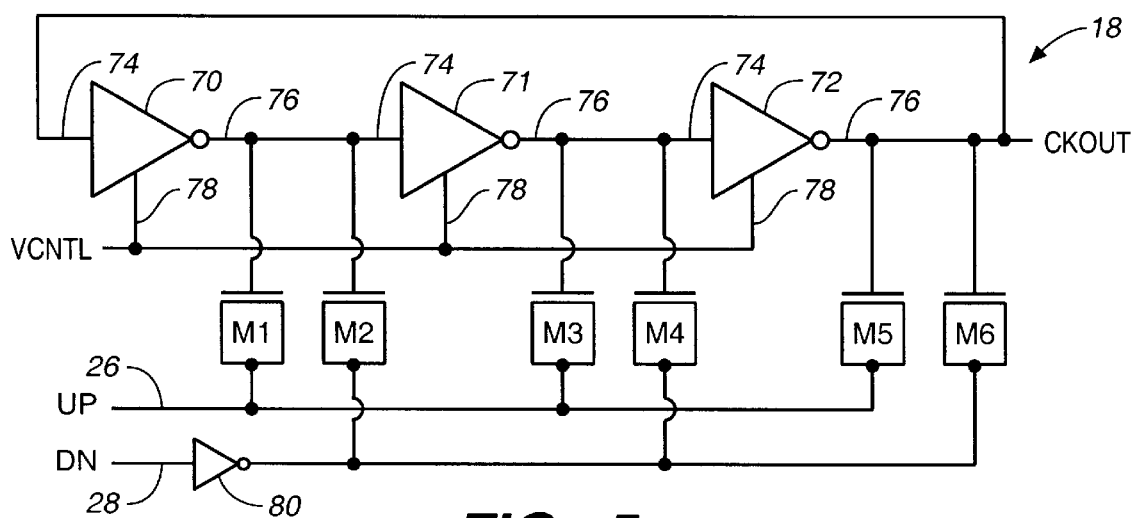
FIG._5

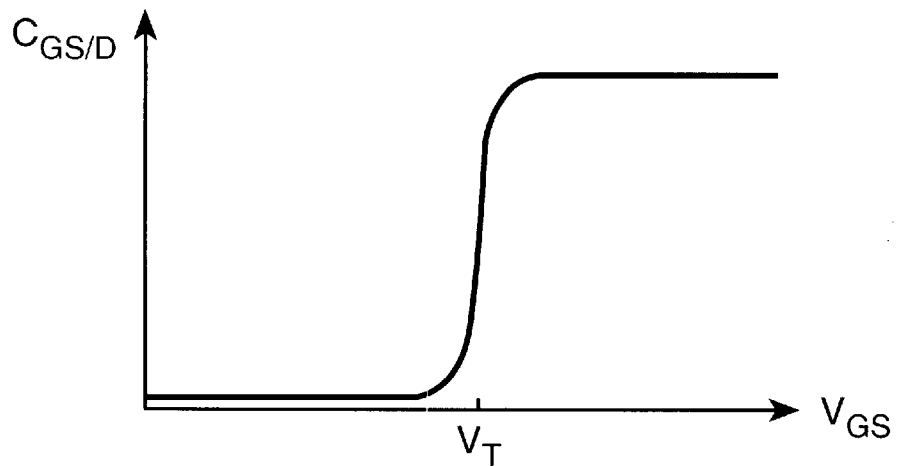
FIG._6
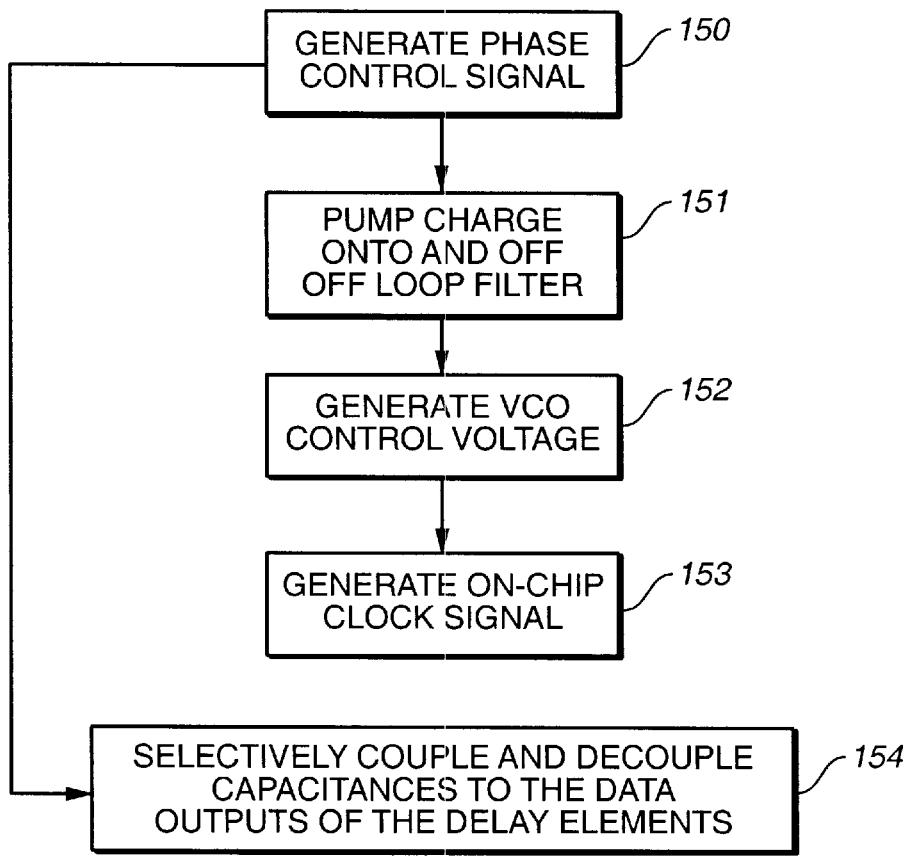
FIG._8

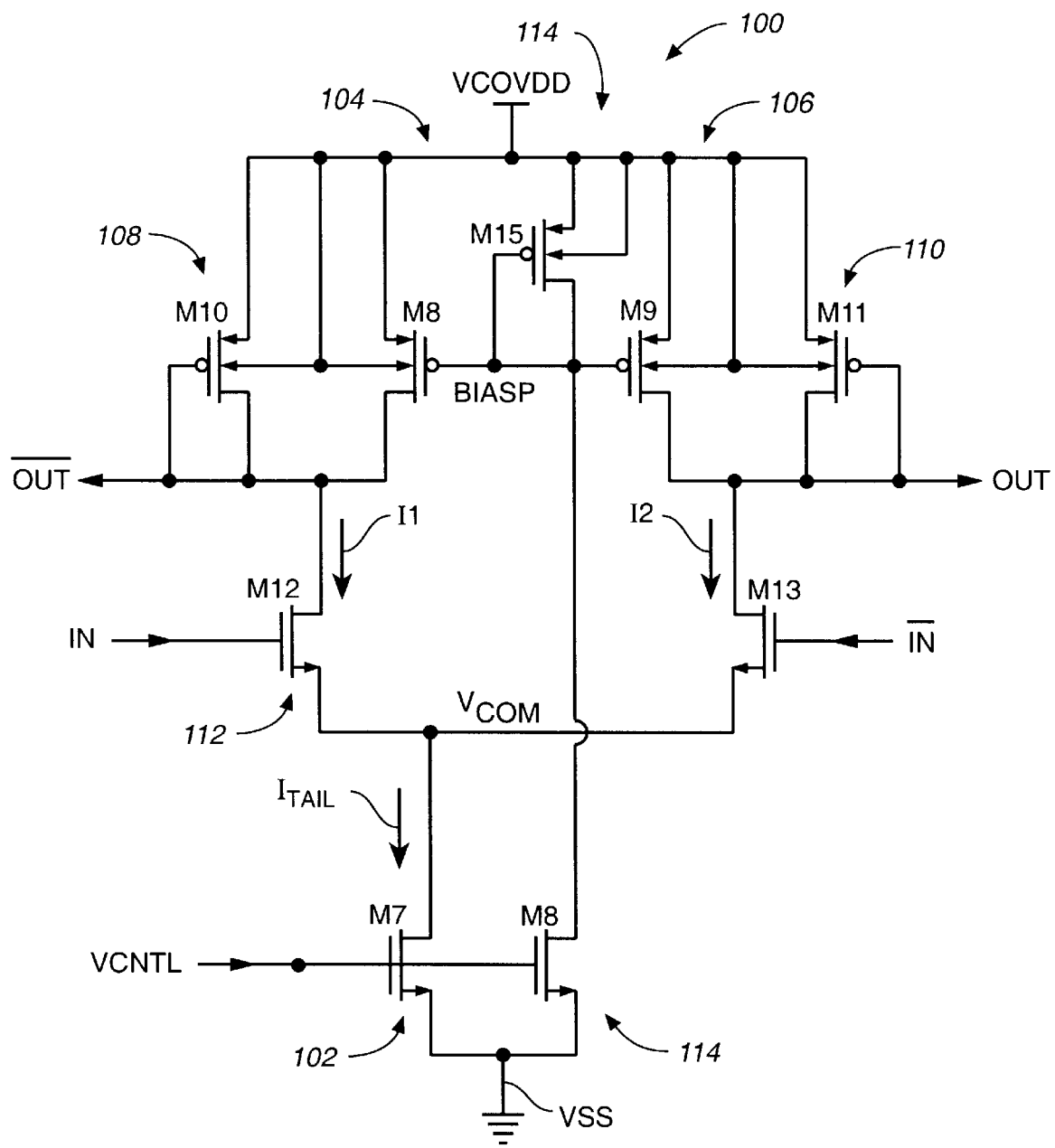
FIG._7

FULLY INTEGRATED PHASE-LOCKED LOOP WITH RESISTOR-LESS LOOP FILER

BACKGROUND OF THE INVENTION

The present invention relates to phase-locked loops (PLLs) and, in particular, to an integrated PLL having a resistor-less loop filter.

PLLs are used in integrated circuits, such as application specific integrated circuits (ASICs), for clock synchronization, recovery of serial data streams and frequency synthesis. A typical PLL includes a phase/frequency detector, a charge pump, a loop filter, a voltage-controlled oscillator (VCO) and a frequency divider. The VCO generates a clock signal with a phase and frequency that is a function of the voltage applied to the oscillator. The phase/frequency detector detects a phase and/or frequency difference between the VCO output and the input signal. The phase/frequency detector generates a control signal as a function of the phase difference and applies the control signal to the charge pump which increases or decreases the voltage across the loop filter. This voltage is applied to the VCO for controlling the oscillation frequency and phase of the clock signal.

A typical first-order loop filter includes a resistor and a capacitor which are coupled together in series between two external pins of the integrated circuit. In a PLL which is fabricated on an integrated circuit, an external loop filter is usually used. An external loop filter is prone to noise pick-up and increases system cost. It is therefore desireable to implement the loop filter on the integrated circuit to form a fully integrated PLL. However, good filter resistors are not readily available in standard digital complementary metal-oxide semiconductor (CMOS) processes. As a result, efforts have been made to eliminate or "replace" the filter resistor in on-chip loop filters of fully integrated PLL's. For example, Ilya I. Novof et al. Fully Integrated CMOS Phase-Locked Loop with 15 to 20 MHz Locking Range and +/−50 ps Jitter, IEEE Journal of Solid State Circuits, Vol. 30, No. 11 (November 1995) discloses a phase-locked loop which uses an auxiliary charge pump for replacing the loop filter.

SUMMARY OF THE INVENTION

The phase-locked loop of the present invention includes a phase detector, a charge pump, a resistor-less loop filter and a voltage-controlled oscillator ("VCO"). The phase detector has a reference input, a feedback input, and a charge control output. The charge pump is coupled to the charge control output, and the resistor-less loop filter is coupled to the charge pump. The VCO has a control voltage input coupled to the resistor-less loop filter, a clock output coupled to the feedback input and a plurality of delay elements which are coupled together in series to form a ring oscillator. Each delay element includes a delay element output. A MOSFET gate oxide capacitance is coupled between each delay element output and the charge control output.

Another aspect of the present invention relates to a method of locking the phase of an on-chip clock signal with the phase of an off-chip reference signal in an integrated circuit, wherein. The method includes: generating a phase control signal as a function of a difference in the phases of the on-chip clock signal and the off-chip reference signal; pumping charge onto and off a resistor-less loop filter as a function of the phase control signal; generating a control voltage as a function of the charge pumped onto and off of the resistor-less loop filter; generating the on-chip clock signal as a function of the control voltage with a plurality of delay elements which are coupled together in series to form a ring oscillator, wherein each delay element includes a delay element output; and selectively coupling and decoupling a capacitance to each delay element output as a function of the phase control signal.

BRIEF DESCRIPTION OF THE DRAWINGS

FIG. 1 is a block diagram of a phase-locked loop (PLL) according to one embodiment of the present invention.

FIG. 2 is a schematic diagram of a phase detector in the PLL shown in FIG. 1 according to one embodiment of the present invention.

FIGS. 3 and 4 are waveform diagrams illustrating the signals on the inputs and outputs of the phase detector shown in FIG. 2.

FIG. 5 is a schematic diagram of a voltage-controlled oscillator ("VCO") in the PLL shown in FIG. 1, according to one embodiment of the present invention.

FIG. 6 is a graph illustrating the gate capacitance of an NMOS transistor as a function of its gate-source voltage.

FIG. 7 is a schematic diagram a VCO delay element within the VCO shown in FIG. 5, according to one embodiment of the present invention.

FIG. 8 is a flow chart of a method of locking onto a phase and frequency of a reference signal according to the present invention.

DETAILED DESCRIPTION OF THE PREFERRED EMBODIMENTS

FIG. 1 is a block diagram of a phase-locked loop (PLL) 10 which is fully integrated on an integrated circuit 11 according to one embodiment of the present invention. PLL 10 includes phase/frequency detector 12, charge pump 14, loop filter 16, voltage-controlled oscillator ("VCO") 18 and voltage supply terminals VDD, VSS and VCOVDD. Voltage supply terminals VDD and VSS are connected to the power and ground supply rails of integrated circuit 11. Voltage supply terminal VCOVDD is coupled to a bias voltage generator (not shown) for generating a bias voltage for VCO 18.

Phase/frequency detector 12 has a reference input REF, a feedback input FB, a charge-increasing charge control output UP and a charge-decreasing charge control output DN. Phase detector 12 receives a reference signal REF, such as an external system clock signal or a serial data stream on reference input REF and compares the phase and frequency of the reference signal with an on-chip clock signal received on feedback input FB. Phase detector 12 generates "up" and "down" phase control signals on charge control outputs UP and DN, respectively, as a function of the difference in phase and frequency and applies the phase control signals to switches 22 and 24 of charge pump 14.

When the system clock leads the clock signal on VCO clock output CKOUT, phase detector 12 generates an "up" phase control signal, such as a pulse, on charge control output UP which momentarity closes switch 22 to increase a voltage across loop filter 16. When the system clock lags the on-chip clock transitions, phase detector 12 generates a "down" phase control signal, such as a pulse, on charge control output DN which momemtarily closes switch 24 to decrease the voltage across loop filter 16.

Loop filter 16 includes capacitor C, which is coupled between filter node 25 and voltage supply terminal VSS. Capacitor C receives a charging/discharging current from charge pump 14, and generates a control voltage on filter node 25 which is applied to control voltage input VCNTL of VCO 18. Loop filter 16 is "resistor-less" in that loop filter 16 has no filter resistor. An effective loop filter resistance is generated within VCO 18 to keep the loop stable.

VCO 18 has a voltage-to-frequency gain $K_{VCO}$ from control voltage input VCNTL to VCO clock output CKOUT which is given by $$K_{VCO} = \frac{\Delta f_{CKOUT}}{\Delta V_{VCNTL}} \qquad \text{Eq. 1}$$

where, $\Delta f_{CKOUT}$ is the change in frequency of the clock signal on VCO clock output CKOUT and $\Delta V_{VCNTL}$ is the change in voltage on control voltage input VCNTL. The clock signal on VCO clock output CKOUT is applied to feedback input FB of phase detector 12. VCO 18 further includes inputs 26 and 28 which are coupled to charge control outputs UP and DN, respectively, of phase detector 12, which provide VCO 18 with additional phase adjustment capability, as described in more detail below.

FIG. 2 is a schematic diagram of phase/frequency detector 12 according to one embodiment of the present invention. Phase/frequency detector 12 includes D-type flip-flops 30 and 32 and AND gate 34. Flip-flop 30 has a data input "D" coupled to voltage supply terminal VDD, a clock input "CK" coupled to reference input REF for receiving the reference signal REF, a reset input "R" coupled to the output of AND gate 34 and a data output "Q" coupled to charge control output UP for generating the "up" phase control signal. Flip-flop 32 has a data input "D" coupled to voltage supply terminal VDD, a clock input "CK" coupled to feedback input FB for receiving the clock signal provided on VCO clock output CKOUT, a reset input "R" coupled to the output of AND gate 34 and a data output "Q" coupled to charge control output DN for generating the "down" phase control signal.

FIG. 3 is a waveform diagram illustrating the signals on the inputs and outputs of phase/frequency detector 12 with VCO 18 running too slow. With VCO 18 running too slow, the reference signal REF leads the feedback signal FB. Phase control signal UP transitions to a logic high level at the rising edge of REF and remains high until the next rising edge of FB, which lags REF. Phase control signal DOWN transitions briefly to a logic high level (not shown), until both UP and DOWN are reset by AND gate 94.

FIG. 4 is a waveform diagram illustrating the signals on the inputs and outputs of phase/frequency detector 12 with VCO 18 running too fast. With VCO 18 running too fast, the reference signal REF lags the feedback signal FB. Phase control signal DOWN transitions to a logic high level at the rising edge of FB and remains high until the next rising edge of REF, which lags FB. Phase control signal UP transitions briefly to a logic high level (not shown), until both UP and DOWN are reset by AND gate 94.

A variety of other phase detector circuits can be used in alternative embodiments of the present invention. For example, Fiedler et al. U.S. Pat. No. 5,633,889, which is entitled "Phase-Locked Loop For Capture Of High Speed Serial Data Streams", discloses a phase detector which can be used with the present invention for detecting the phase and frequency of a serial data stream at the outputs of a multiple-bit capture latch.

FIG. 5 is a diagram showing VCO 18 in greater detail according to one embodiment of the present invention. VCO 18 is formed of a plurality of delay elements 70, 71 and 72 which are coupled together in series to form a ring oscillator. Each delay element has an input 74 and a delay element output 76. The output 76 of each delay element 70–72 is coupled to the input 74 the next delay element in the ring. At least one of the delay elements is inverting. In the embodiment shown in FIG. 9, all of the delay elements 70–71 are inverting. Each delay element 70–72 can be single-ended or double-ended. The series of delay elements 70–72 oscillates and provides an on-chip clock signal on VCO clock output CKOUT.

The propagation delay through each delay element 70–72 is partly set by the controlling the current available in the delay element to charge and to discharge the load present at its output. By controlling this current, the propagation delay and thus the frequency of oscillation of the clock signal on VCO clock output CKOUT is thereby controlled. The amount of current available in each delay element 70–72 is determined by the voltage applied to propagation delay control inputs 78 of each delay element, which are coupled to control voltage input VCNTL.

VCO 18 further includes N-channel metal-oxide semiconductor field-effect transistors (MOSFETs) M1–M6. Transistor M1 has a gate coupled to output 76 of delay element 70 and a source and drain coupled to charge control output UP of phase detector 12. Transistor M2 has a gate coupled to output 76 of delay element 70 and a source and drain coupled to charge control output DN of phase detector 12 through an inverter 80. Transistor M3 has a gate coupled to output 76 of delay element 71 and a source and drain coupled to charge control output UP of phase detector 12. Transistor M4 has a gate coupled to output 76 of delay element 71 and a source and drain coupled to charge control output DN of phase detector 12 through inverter 80. Transistor M5 has a gate coupled to output 76 of delay element 72 and a source and drain coupled to charge control output UP of phase detector 12. Transistor M6 has a gate coupled to output 76 of delay element 72 and a source and drain coupled to charge control output DN of phase detector 12 through inverter 80.

FIG. 6 is a graph illustrating the gate oxide capacitance of transistors M1–M6 as a function of the gate-to-source voltage $V_{GS}$. If the gate-to-source voltage $V_{GS}$ is greater than the turn-on threshold voltage $V_T$ of the transistor, then the gate will "see" a capacitance from its gate to its source and drain. If the gate-to-source voltage $V_{GS}$ is smaller than the turn-on threshold voltage $V_T$ of the transistor, then the gate will "see" substantially no capacitance from its gate to its source and drain.

Referring to the waveform diagram shown in FIG. 3, when phase detector 12 detects a lag in VCO clock output CKOUT, phase detector 12 generates a pulse on charge control output UP. During this pulse, the gate-to-source voltage $V_{GS}$ of transistors M1, M3 and M5 will be less than the threshold voltage $V_T$, such that effectively no gate oxide capacitance is coupled to outputs 76 from transistors M1, M3 and M5. Delay elements 70–72 drive a smaller load at their outputs, causing VCO 18 to run faster.

Referring to the waveform diagram shown in FIG. 4, when phase detector 12 detects a lead in VCO clock output CKOUT, phase detector generates a pulse on charge control output DN. This pulse is inverted into a logical zero pulse by inverter 80. During the logical zero pulse, the gate-to-source voltage $V_{GS}$ of transistors M2, M4 and M6 will be greater than the threshold voltage $V_T$, such that the gate oxide capacitances of transistors M2, M4 and M6 increase at outputs 76. Delay elements 70–72 drive a larger load at their outputs, causing VCO 18 to run slower.

Selectively coupling and decoupling the gate oxide capacitances of transistors M1–M6 to the outputs of the delay elements has the effect of adding a filter resistance to the PLL. The effective filter resistance can be calculated using HSPICE for purposes of loop analysis. Assume an UP pulse having a pulse width τ causes a phase lead φ in VCO 18. For a standard resistor-capacitor loop filter, an UP pulse with a width τ will generate a phase lead of:

$$\phi = R_{EFF} I_{IN} K_{VCO} \tau \quad \text{Eq. 2}$$

where $R_{EFF}$ is the effective resistance of the filter resistor, $I_{IN}$ is the current supplied by the charge pump and $K_{VCO}$ is the voltage-to-frequency gain of the VCO. Solving for $R_{EFF}$, $$R_{EFF} = \phi / \{I_{IN} K_{VCO} \tau\} \quad \text{Eq. 3}$$

By measuring the phase lead φ in VCO 18 of the present invention caused by an UP pulse having a pulse width τ, and by knowing the gain $K_{VCO}$ of VCO 18, the effective filter resistance introduced by transistors M1–M6 can be calculated. This resistance can then be used for traditional performing loop analysis.

For simplicity, delay elements 70–72 are shown in FIG. 5 as being single-ended. However, each delay element 70–72 can also be double-ended (i.e. differential). A double-ended delay element has complementary inputs and complementary outputs. A pair of transistors, similar to transistors M1–M6, are coupled between each of the complementary outputs of each delay element and the respective charge control outputs UP and DN of phase detector 12.

FIG. 7 is a schematic diagram of a basic differential (or "double-ended") inverting delay element that can be used as one of the delay elements 70–72 within VCO 18, according to one embodiment of the present invention. Differential inverting delay element 100 includes tail current source 102, pull-up current sources 104 and 106, clamp circuits 108 and 110, current steering circuit 112 and pull-up bias generator 114. Tail current source 102 includes N-channel transistor M7 having a gate coupled to control voltage input VCNTL, a source coupled to voltage supply input VSS and a drain coupled to common voltage node $V_{COM}$. Transistor M1 generates a tail current $I_{TAIL}$ at its drain as a function of the voltage on control voltage input VCNTL.

Pull-up current sources 104 and 106 include P-channel transistors M8 and M9, respectively. Transistor M8 has a gate coupled to P-channel bias node BIASP, a source and substrate coupled to VCOVDD and a drain coupled to output terminal $\overline{\text{OUT}}$. Transistor M9 has a gate coupled to P-channel bias node BIASP, a source and a substrate coupled to VCOVDD and a drain coupled to output terminal OUT.

Clamp circuits 108 and 110 include P-channel transistors M10 and M11, respectfully. Transistor M10 has a gate and drain coupled to output terminal $\overline{\text{OUT}}$ and a source and a substrate coupled to VCOVDD. Transistor M11 has a gate and drain coupled to output terminal OUT and a source and a substrate coupled to VCOVDD.

Current steering circuit 112 includes N-channel transistors M12 and M13 which steer the tail current $I_{TAIL}$ through either transistor M12 as current I1 or transistor M13 as current I2 as a function of the voltages on complementary inputs IN and $\overline{\text{IN}}$, respectively. Transistor M12 has a gate coupled to input IN, a source coupled to common node $V_{COM}$ and a drain coupled to output terminal $\overline{\text{OUT}}$. Transistor M13 has a gate coupled to input terminal $\overline{\text{IN}}$, a source coupled to common node $V_{COM}$ and a drain coupled to output terminal OUT.

Pull-up bias generator 114 includes N-channel transistors M14 and P-channel transistor M15. N-channel transistor M14 has a gate coupled to control voltage input VCNTL, a source coupled to VSS and a drain coupled to P-channel bias node BIASP. P-channel transistor M15 has a gate and drain coupled to P-channel bias node BIASP, and a source and substrate coupled to VCOVDD. Pull-up bias generator 114 generates a bias voltage on P-channel bias node BIASP for P-channel transistors M8 and M9. In an alternative embodiment (not shown), delay element 100 further includes additional cascode transistors in current source 102 and in pull-up bias generator 114.

The switching delay through differential inverting delay element 100 is partly a function of the voltage applied to control voltage input VCNTL and partly a function of the capacitive load coupled to output terminals OUT and $\overline{\text{OUT}}$. Selectively adding and subtracting a MOSFET gate oxide capacitance to each output terminal as a function of whether the VCO lags or leads the reference signal therefore increases and decreases the switching delay through delay element 100.

FIG. 8 is a flow chart of a method of locking the phase of an on-chip clock signal with the phase of an off-chip reference signal in an integrated circuit. At step 150, phase detector 12 (shown in FIG. 1) generates a phase control signal as a function of a difference in the phases of the on-chip clock signal and the off-chip reference signal. Charge pump 14 pumps charge onto and off resistor-less loop filter 16 as a function of the phase control signal, at step 151. Resistor-less loop filter 16 generates a control voltage as a function of the charge pumped onto and off of the resistor-less loop filter, at step 152. VCO 18 generates the on-chip clock signal as a function of the control voltage with the plurality of delay elements 70–72 which are coupled together in series to form a ring oscillator, at step 153. At step 154, the gate oxide capacitances of transistors M1–M6 are selectively coupled and decoupled to the delay element output 76 of each delay element 70–72 as a function of the phase control signal generated by phase detector 12.

The PLL of the present invention has a resistor-less loop filter and can therefore be easily integrated on an integrated circuit. The filter resistor is replaced by only a few small transistors in the VCO. This saves considerable area on the integrated circuit and reduces design complexity as compared to other fully integrated PLLs of the prior art.

Although the present invention has been described with reference to preferred embodiments, workers skilled in the art will recognize that changes may be made in form and detail without departing from the spirit and scope of the invention. For example, N-channel transistors M1–M6 can be replaced with P-channel transistors. Individual signals can be active high or active low, and corresponding circuitry can be inverted to suit a particular convention. The term "coupled" can include various types of connections or couplings and can include a direct connection or a connection through one or more intermediate components.

What is claimed is:

1. A phase-locked loop comprising:
   a phase detector comprising a reference input, a feedback input, and a charge control output;
   a charge pump coupled to the charge control output;
   a resistor-less loop filter coupled to the charge pump;
   a voltage controlled oscillator (VCO) comprising a control voltage input coupled to the resistor-less loop filter, a clock output coupled to the feedback input and a plurality of delay elements which are coupled together in series to form a ring oscillator, wherein each delay element includes a delay element output; and
   a plurality of metal-oxide semiconductor field-effect transistor (MOSFET) gate oxide capacitances, wherein each capacitance is coupled between a respective delay element output and the charge control output.

2. The phase-locked loop of claim 1 wherein the phase-locked loop is fully integrated on an integrated circuit.

3. The phase-locked loop of claim 1 wherein each of the plurality of MOSFET gate oxide capacitances comprises an N-channel transistor having a gate coupled to the respective delay element output and a source and drain coupled to the charge control output.

4. The phase-locked loop of claim 1 wherein:
the charge control output of the phase detector comprises a charge-increasing control output and a charge-decreasing control output; and
the plurality of MOSFET gate oxide capacitances comprises a first set of gate oxide capacitances which are coupled between the respective delay element outputs and the charge-increasing control output and a second set of gate oxide capacitances which are coupled between the respective delay element outputs and the charge-decreasing control output.

5. The phase-locked loop of claim 4 and further comprising an inverter coupled between each of the MOSFET gate oxide capacitances in the second set and the charge-decreasing control output.

6. The phase-locked loop of claim 4 wherein the phase detector further comprises:
means for receiving a reference signal on the reference input;
means for receiving a feedback signal on the feedback input;
means for comparing a phase of the reference signal with a phase of the feedback signal; and
means for generating pulses on the charge-increasing control output when the phase of the reference signal leads the phase of the feedback signal and for generating pulses on the charge-decreasing control output when the phase of the reference signal lags the phase of the feedback signal.

7. A phase-locked loop comprising:
phase detector means for generating a phase control signal as a function of a phase difference between a reference signal and a feedback signal;
charge pump means coupled to the phase detector means for pumping charge into and out of a charge pump output as a function of the phase control signal;
resistor-less loop filter means coupled to the charge pump output for generating a control voltage on a filter output as a function of the charge pumped into and out of the charge pump output;
voltage controlled oscillator (VCO) means coupled to the filter output for generating the feedback signal as a function of the control voltage, wherein the VCO means comprises a plurality of delay elements which are coupled together in series, wherein each delay element includes a delay element output; and
means for selectively coupling and decoupling a capacitance to each delay element output as a function of the phase control signal.

8. The phase-locked loop of claim 7 wherein the phase-locked loop is fully integrated on an integrated circuit.

9. The phase-locked loop of claim 7 wherein the means for selectively coupling and decoupling a capacitance comprises a plurality of N-channel transistors, wherein each N-channel transistor comprises a gate coupled to the delay element output of a respective one of the plurality of delay elements and a source and drain coupled to the phase detector means for receiving the phase control signal.

10. The phase-locked loop of claim 7 wherein:
the phase detector means comprises a charge-increasing control output and a charge-decreasing charge control output; and
the means for selectively coupling and decoupling a capacitance comprises a first set of metal-oxide semiconductor field-effect transistor (MOSFET) gate oxide capacitances which are coupled between respective ones of the delay element outputs and the charge-increasing control output and a second set of MOSFET gate oxide capacitances which are coupled between respective ones of the delay element outputs and the charge-decreasing control output.

11. The phase-locked loop of claim 10 and further comprising an inverter coupled between each of the MOSFET gate oxide capacitances in the second set and the charge-decreasing control output.

12. The phase-locked loop of claim 10 wherein the phase detector means further comprises:
means for generating pulses on the charge-increasing control output when the phase of the reference signal leads the phase of the feedback signal and for generating pulses on the charge-decreasing control output when the phase of the reference signal lags the phase of the feedback signal.

13. A method of locking the phase of an on-chip clock signal with the phase of an off-chip reference signal in an integrated circuit, the method comprising:
generating a phase control signal as a function of a difference in the phases of the on-chip clock signal and the off-chip reference signal;
pumping charge onto and off a resistor-less loop filter as a function of the phase control signal;
generating a control voltage as a function of the charge pumped onto and off of the resistor-less loop filter;
generating the on-chip clock signal as a function of the control voltage with a plurality of delay elements which are coupled together in series to form a ring oscillator, wherein each delay element includes a delay element output; and
selectively coupling and decoupling a capacitance to each delay element output as a function of the phase control signal.

14. The method of claim 13 wherein selectively coupling and decoupling a capacitance comprises, for each delay element:
coupling the gate of a transistor to the delay element output; and
selectively turning the transistor on and off as a function of the phase control signal.

15. The method of claim 14 wherein:
generating a phase control signal comprises generating a first set of pulses when the off-chip reference signal leads the on-chip clock signal and generating a second set of pulses when the off-chip reference signal lags the on-chip clock signal; and
selectively coupling and decoupling a capacitance comprises, for each delay element, coupling the gate of a first transistor and the gate of a second transistor to the delay element output, selectively turning the first transistor off in response to the first set of pulses and selectively turning the second transistor on in response to the second set of pulses.

* * * * *